(12) United States Patent
Kim et al.

(10) Patent No.: US 12,495,684 B2
(45) Date of Patent: Dec. 9, 2025

(54) DISPLAY APPARATUS

(71) Applicant: LG Display Co., Ltd., Seoul (KR)

(72) Inventors: Taehwi Kim, Busan (KR); ChungWan Oh, Paju-si (KR)

(73) Assignee: LG Display Co., Ltd., Seoul (KR)

(*) Notice: Subject to any disclaimer, the term of this patent is extended or adjusted under 35 U.S.C. 154(b) by 1038 days.

(21) Appl. No.: 17/535,039

(22) Filed: Nov. 24, 2021

(65) Prior Publication Data
US 2022/0173201 A1 Jun. 2, 2022

(30) Foreign Application Priority Data

Dec. 1, 2020 (KR) .................. 10-2020-0166082

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
CPC .................................................. H10K 59/131
See application file for complete search history.

(56) References Cited

U.S. PATENT DOCUMENTS

| 2019/0207168 A1* | 7/2019 | Lee ..................... H10K 50/844 |
| 2019/0386032 A1* | 12/2019 | Hsu ..................... G02F 1/13458 |
| 2020/0321421 A1* | 10/2020 | Jeon ..................... H10K 59/123 |

FOREIGN PATENT DOCUMENTS

| KR | 10-2019-0036198 A | 4/2019 |
| KR | 10-2020-0117098 A | 10/2020 |

OTHER PUBLICATIONS

Korean Intellectual Property Office, Office Action, Korean Patent Application No. 10-2020-0166082, May 23, 2025, 17 pages.

* cited by examiner

*Primary Examiner* — Mounir S Amer
(74) *Attorney, Agent, or Firm* — Fenwick & West LLP

(57) ABSTRACT

Provided is a display apparatus. The display apparatus includes a substrate including an active area and an inactive area. The display apparatus further includes a transistor and a light emitting diode in the active area. The display apparatus further includes a circuit unit, a dam, and a reference power voltage line in the inactive area. The reference power voltage line includes a first conductive layer, a second conductive layer, and a third conductive layer in the inactive area, wherein at least one of the first conductive layer, the second conductive layer, or the third conducive layer horizontally overlaps with a remaining two conductive layers included in the reference power voltage line in a vertical direction.

11 Claims, 8 Drawing Sheets

DISPLAY APPARATUS

CROSS-REFERENCE TO RELATED APPLICATION

This application claims the priority of Republic of Korea Patent Application No. 10-2020-0166082 filed on Dec. 1, 2020, in the Korean Intellectual Property Office, the disclosure of which is hereby incorporated by reference in its entirety.

BACKGROUND

Field

The present disclosure relates to a display apparatus, such as an organic light emitting display apparatus.

Description of the Related Art

Recently, as an information era is entered, a display field which visually expresses electrical information signals has been rapidly developed and in response, various display apparatuses having excellent performances such as thin-thickness, light weight, and low power consumption have been developed.

Specific examples of the display apparatus may include a liquid crystal display apparatus (LCD), an organic light emitting display apparatus (OLED), a quantum dot display apparatus, and the like.

An organic light emitting diode is a self-emitting device using a thin light emitting layer between electrodes so that it can be manufactured to be thin. The normal organic light emitting display apparatus has a structure in which a pixel driving circuit and an organic light emitting diode are formed on a substrate and light emitted from the organic light emitting diode passes through the substrate or a barrier layer to display images.

Recently, in accordance with the reduction in the size and improvement of the resolution of the organic light emitting display apparatus, necessary wiring lines are increased, but a space for disposing the wiring lines becomes insufficient. In this situation, it is important to secure a space for disposing various elements including electrical lines. Moreover, studies are also being conducted to efficiently dispose various components and elements. These studies are mainly conducted for new designs and user interface/user experience (UI/UX) and are also conducted to reduce an area of an outer periphery of the display apparatus.

SUMMARY

An object of the present disclosure is to propose an outer peripheral structure of an organic light emitting display apparatus.

Objects of the present disclosure are not limited to the above-mentioned objects, and other objects, which are not mentioned above, can be clearly understood by those skilled in the art from the following descriptions.

According to an aspect of the present disclosure, the display apparatus includes a substrate including an active area and an inactive area; a transistor and a light emitting diode in the active area, the light emitting diode electrically connected to the transistor; and a circuit unit, a dam, and a reference power voltage line in the inactive area, wherein the reference power voltage line includes a first conductive layer, a second conductive layer, and a third conductive layer in the inactive area, wherein at least one of the first conductive layer, the second conductive layer, or the third conducive layer horizontally overlaps with a remaining two conductive layers included in the reference power voltage line in a vertical direction.

According to an aspect of the present disclosure, the display apparatus comprises a substrate including an active area and an inactive area; a transistor and a light emitting diode in the active area, the light emitting diode electrically connected to the transistor; and a reference power voltage line disposed in the inactive area, wherein the reference power voltage line includes a first conductive layer, a second conductive layer, and a third conductive layers\, wherein horizontal widths of the first conductive layer, the second conductive layer, and the third conductive layers are different in a plan view of the display apparatus.

In one embodiment, a display apparatus comprises: a substrate including an active area and an inactive area; a plurality of organic light emitting diodes disposed in the active area; a plurality of trenches disposed in the active area; and a reference power voltage line in the inactive area, the reference power voltage line configured to supply reference power to drive the plurality of organic light emitting diodes; wherein the reference power voltage line includes a first conductive layer, a second conductive layer, and a third conductive layer that horizontally overlap each other in a vertical direction; wherein the second conductive layer is in direct contact with the first conductive layer and the third conductive layer through the plurality of trenches.

Other detailed matters of the exemplary embodiments are included in the detailed description and the drawings.

According to the display apparatus according to the exemplary embodiment of the present disclosure, a structure of a reference power voltage line is changed to reduce a voltage variation in each area of a display panel due to a resistance generated in the reference power voltage line.

According to the display apparatus according to the exemplary embodiment of the present disclosure, a voltage variation of a cathode electrode when VSS rising phenomenon occurs may be reduced.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
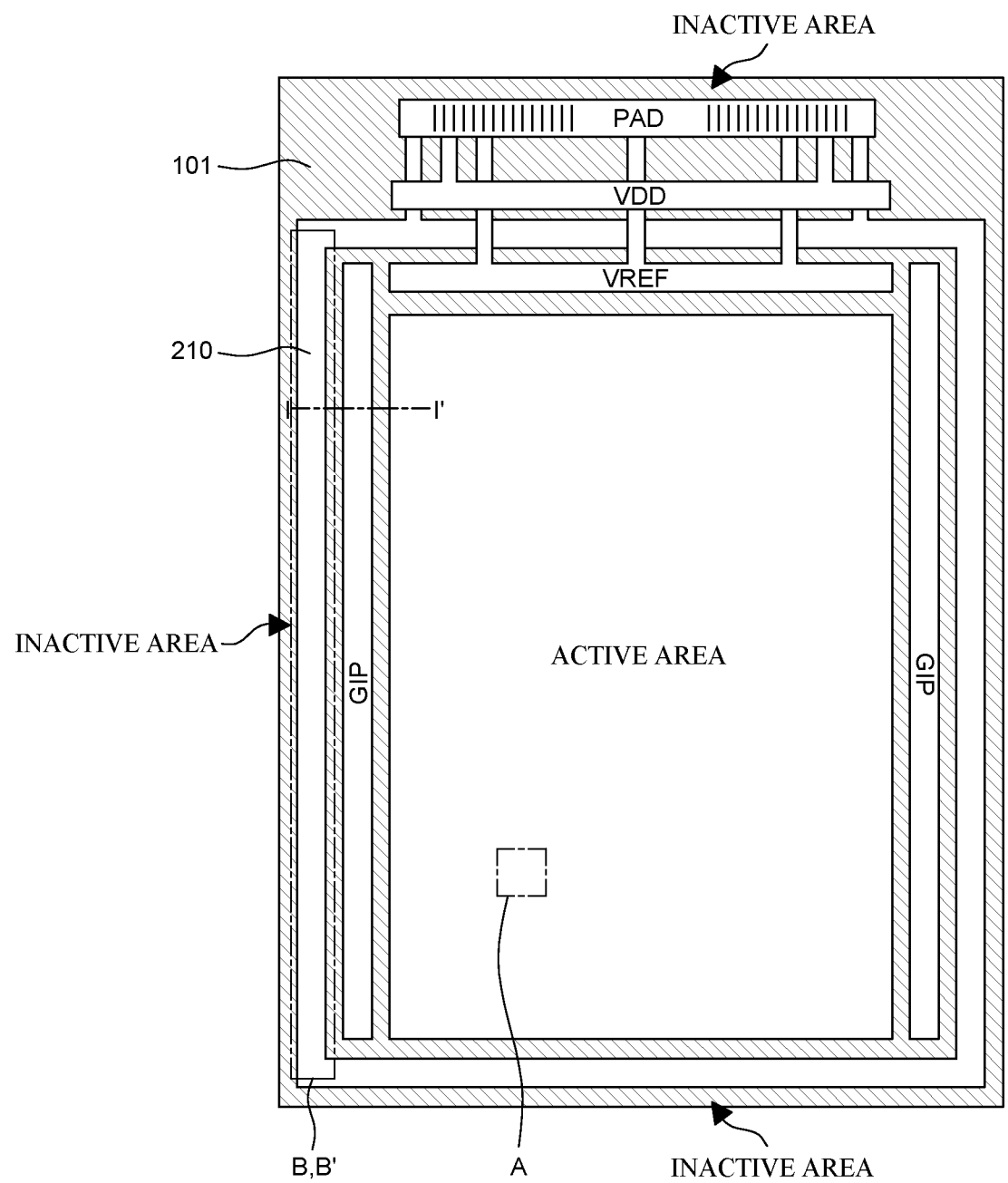
FIG. 1 is a view illustrating a front surface of a display panel according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

In the present disclosure, a display apparatus may include a liquid crystal module (LCM) including a display panel and a driver for driving the display panel, an organic light emitting display module (OLED module), and a quantum dot module (QD module). In addition, the display apparatus may also include equipment display apparatus including complete product or final product of LCM, OLED or QD module, for example, notebook computer, television, computer monitor, automotive display apparatus, or other vehicle display apparatuses, and set electronic devices or set device (set apparatus) such as mobile electronic devices of smart phone or electronic pad.

Accordingly, the display apparatus according to the present disclosure may include application products or set apparatuses such as final products including the LCM, OLED or QD module as well as display apparatuses such as LCM, OLED or QD module.

If needed, the LCM, OLED or QD module configured as the display panel, the driver, and the like may be expressed as the "display apparatus", and the electronic device of the final product including the LCM, OLED or QD module may be expressed as the "set apparatus". For example, the display apparatus may include a display panel of LCD, OLED or QD, and a source printed circuit board (source PCB) as a controller for driving the display panel. Meanwhile, the set apparatus may further include a set PCB as a set controller, which is electrically connected to the source PCB, so as to control the entire set apparatus.

The display panel used for the present exemplary embodiment may be all types of display panels, for example, a liquid crystal display panel, an organic light emitting diode OLED display panel, a quantum dot QD display panel, an electroluminescent display panel, and the like. The display panel is not limited to a particular display panel including a flexible substrate for an OLED display panel and a backplane support structure disposed beneath the display panel, thereby being capable of achieving bezel bending. The display panel used in the display apparatus according to an exemplary embodiment of the present disclosure is not limited in shape and size.

More specifically, when the display panel is an OLED display panel, the display panel may include a plurality of gate lines, a plurality of data lines, and a plurality of pixels PXL provided in respective intersections between the gate lines and the data lines. In addition, the display panel may further include an array including thin film transistors as elements for selectively applying a voltage to each of the pixels, an OLED layer disposed on the array, and an encapsulation substrate or an encapsulation layer disposed on the array to cover the OLED layer. The encapsulation layer protects the thin film transistors and the OLED layer from external impact and suppresses the permeation of moisture or oxygen into the OLED layer. Layers formed on the array may include an inorganic light emitting layer, for example, a nano-sized material layer or a quantum dot layer, and the like.

In the present specification, FIG. 1 illustrates an exemplary organic light emitting diode (OLED) display panel which may be integrated into the display apparatuses.

FIG. 1 illustrates an exemplary display apparatus which may be included in an electronic apparatus.

Referring to FIG. 1, the display apparatus 100 includes at least one active area and an array of pixels is formed in the active area. One or more inactive areas may be disposed around the active area. That is, the inactive area may be adjacent to one or more side surfaces of the active area. In FIG. 1, the inactive area encloses a quadrangular active area. However, a shape of the active area and a shape and a placement of the inactive area adjacent to the active area are not limited to an example illustrated in FIG. 1. The active area and the inactive area may have a shape suitable for a design of an electronic apparatus mounted with the display apparatus 100. An exemplary shape of the active area is a pentagon, a hexagon, a circle, an oval, and the like.

Each pixel in the active area may be associated with a pixel circuit. The pixel circuit may include one or more switching transistors and one or more driving transistors on a substrate 101. Each pixel circuit may be electrically connected to a gate line and a data line in order to communicate with one or more driving circuits such as a gate driver and a data driver located in the inactive area. The pixel may include an organic light emitting diode.

The driving circuit may be implemented by a thin film transistor TFT in the inactive area as illustrated in FIG. 1. The driving circuit may be referred to as a gate-in-panel GIP. Further, some components such as a data driver IC are mounted on a divided printed circuit board and are coupled to the connection interface (a pad/bump or a pin) disposed in the inactive area using a circuit film such as a flexible printed circuit board (FPCB), a chip-on-film (COF), or a tape-carrier-package (TCP). The inactive area is bent together with the connection interface so that the printed circuit board (COF or PCB) may be located at a rear side of the display apparatus 100.

The display apparatus 100 may further include a power controller which supplies various voltages or currents to the pixel circuit, the data driver, the gate driver, and the like or controls to supply the voltages or currents. Such a power controller is also referred to as a power management IC (PMIC). Further, as illustrated in the drawing, the display apparatus 100 may include a high potential voltage VDD related to the driving of the pixel circuit, a reference power voltage line (VSS) 210, and a voltage line which supplies a reference voltage VRFB.

In the meantime, the display apparatus 100 may further include various additional elements to generate various signals or drive the organic light emitting diode in the active area. The additional element which drives the organic light emitting diode may include an inverter circuit, a multiplexer, an electrostatic discharging circuit, and the like. The display apparatus 100 may further include an additional element associated with a function other than a function of driving the organic light emitting diode. For example, the display apparatus 100 may include additional elements which provide a touch sensing function, a user authentication function (for example, fingerprint recognition), a multilevel pressure sensing function, a tactile feedback function, or the like.

The above-mentioned additional elements may be located in an external circuit which is connected to the inactive area and/or the connection interface.

The reference power voltage line VSS 210 may be disposed in an outer inactive area I/A of the display apparatus 100 to enclose the active area A/A. The reason for the above placement is to easily provide the reference power to the cathode electrodes of all the organic light emitting diodes disposed in the active area A/A with a shortest distance to reduce an electric resistance.

However, an electric resistance of a reference power voltage line 210 which is far from the power source or the connection interface (a pad/bump, or a pin) to which a power source is connected is higher than that of a reference power voltage line 210 which is close to the power source. Therefore, a VSS rising phenomenon occurs, which may cause luminance irregularity of the organic light emitting diode. A structure for solving the above-mentioned problem will be described in detail with reference to FIGS. 4 to 7.

Figure 2:
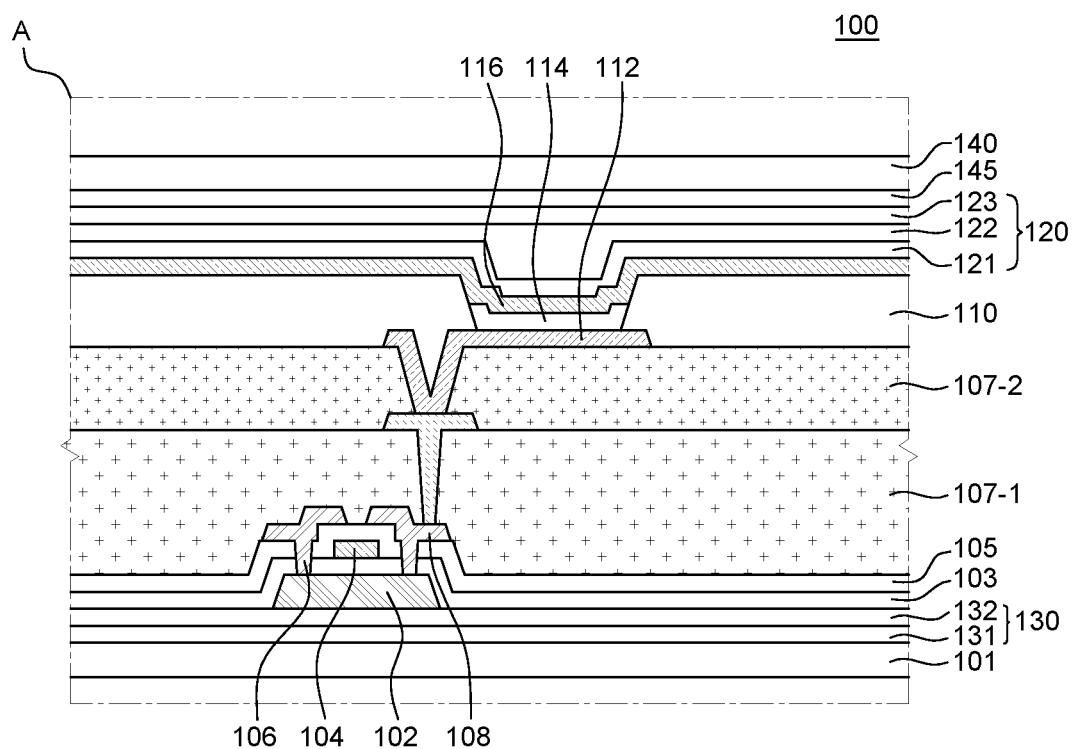
FIG. 2 is a plan view illustrating an active area by enlarging a region A of FIG. 1 according to the exemplary embodiment of the present disclosure.

FIG. 2 is a cross-sectional view illustrating a region A of an active area A/A of the display apparatus according to one embodiment. The display apparatus 100 of FIG. 2 has an exemplary structure with two planarization layers. In the display apparatus 100, thin film transistors, organic light emitting diodes, and various functional layers are located on the substrate 101.

The substrate 101 may be a glass or plastic substrate. When the substrate is a plastic substrate, polyimide-based or polycarbonate-based materials are used so that the substrate may have flexibility. Specifically, polyimide may be applied to a high temperature process and may be coated so that polyimide may be frequently used for the plastic substrate.

A buffer layer 130 is a functional layer which protects electrodes/electric wires from impurities such as alkali ions leaked from the substrate 101 or layers there below. The buffer layer may be formed of silicon oxide SiOx, silicon nitride SiNx, or multiple layers thereof. The buffer layer 130 may include a multi buffer 131 and/or an active buffer 132. The multi buffer 131 may be formed by alternately laminating silicon nitride SiNx and silicon oxide SiOx and delay the diffusion of the moisture and/or oxygen which permeate the substrate 101. The active buffer 132 protects a semiconductor layer 102 of the transistor and blocks various types of defects entering from the substrate 101. The active buffer 132 may be formed of amorphous silicon (a-Si).

The thin film transistor may be formed by sequentially disposing a semiconductor layer 102, a gate insulating layer 103, a gate electrode 104, an interlayer insulating layer 105, source and drain electrodes 106 and 108. The semiconductor layer 102 is located on the buffer layer 130. The semiconductor layer 102 may be made of poly silicon (p-Si). In this case, a predetermined region may be doped with impurities. Further, the semiconductor layer 102 may be made of amorphous silicon (a-Si) or various organic semiconductor materials such as pentacene. Moreover, the semiconductor layer 102 may be made of oxide. The gate insulating layer 103 may be formed of an insulating inorganic material such as silicon oxide SiOx or silicon nitride SiNx or other insulating organic materials. The gate electrode 104 may be formed of various conductive materials, for example, magnesium (Mg), aluminum (Al), nickel (Ni), chrome (Cr), molybdenum (Mo), tungsten (W), gold (Au), or an alloy thereof.

The interlayer insulating layer 105 may be formed of an insulating material such as silicon oxide SiOx or silicon nitride SiNx or other insulating organic material. The interlayer insulating layer 105 and the gate insulating layer 103 are selectively removed to form a contact hole through which the source and drain regions are exposed.

The source and drain electrodes 106 and 108 are formed on the interlayer insulating layer 105 as a single layer or multiple layers with a material for an electrode. If necessary, a passivation layer which is configured with an inorganic insulating material may cover the source and drain electrodes 106 and 108.

A first planarization layer 107-1 is located on the thin film transistor. The first planarization layer 107-1 protects the thin film transistor and planarizes an upper portion thereof. The first planarization layer 107-1 may be configured with various forms and may be formed of one or more of an acrylic resin, an epoxy resin, a phenol resin, a polyamide resin, a polyimide resin, an unsaturated polyester resin, a polyphenylene resin, and a polyphenylene sulfide resin, but is not limited thereto.

Various metal layers which serve as an electric wire/electrode may be disposed above the first planarization layer 107-1.

A second planarization layer 107-2 is located above the first planarization layer 107-1. As the display apparatus 100 evolves to have a higher resolution, various signal lines are increased so that two planarization layers are provided. Therefore, it is difficult to dispose all the wiring lines on one layer while ensuring a minimum interval so that an additional layer is provided. There is a margin in the placement of the wiring line by providing such an additional layer (the second planarization layer), which makes it easier to design the electric wire/electrode placement. Further, when a dielectric material is used for the planarization layers 107-1 and 107-2, the planarization layers 107-1 and 107-2 may be utilized to form capacitance between the metal layers.

The organic light emitting diode may be formed such that an anode electrode 112, an organic light emitting layer 114, and a cathode electrode 116 are sequentially disposed. That is, the organic light emitting diode may be configured by the anode electrode 112 formed on the planarization layer 107, the organic light emitting layer 114 located on the anode electrode 112, and the cathode electrode 116 located on the organic light emitting layer 114.

The anode electrode 112 may be electrically connected to a drain electrode of the driving thin film transistor by means of a connection electrode. When the organic light emitting display apparatus 100 is a top emission type, the anode electrode 112 may be formed of an opaque conductive material having high reflectance. For example, the anode electrode 112 may be formed of silver (Ag), aluminum (Al), gold (Au), molybdenum (Mo), tungsten (W), chrome (Cr), or an alloy thereof. The connection electrode 108-2 may be made of the same material as the source and drain electrodes 106 and 108.

A bank 110 is formed in a remaining area excluding an emission area. Therefore, the bank 110 has a bank hole which exposes the anode electrode 112 corresponding to the emission area. The bank 110 may be made of an inorganic insulating material such as a silicon nitride film (SiNx) or a silicon oxide film (SiOx) or an organic insulating material such as BCB, an acrylic resin or an imide resin.

The organic light emitting layer 114 is located on the anode electrode 112 which is exposed by the bank 110. The organic light emitting layer 114 may include a light emitting layer, an electron injection layer, an electron transport layer, a hole transport layer, a hole injection layer, and the like.

The cathode electrode 116 is located on the organic light emitting layer 114. When the organic light emitting display apparatus 100 is a top emission type, the cathode electrode 116 is formed of a transparent conductive material such as indium tin oxide ITO or indium zinc oxide IZO to emit light generated in the organic light emitting layer 114 above the cathode electrode 116.

An encapsulation layer 120 is located on the cathode electrode 116. The encapsulation layer 120 suppresses the permeation of the oxygen and moisture from the outside to suppress the oxidation of a light emitting material and an electrode material. When the organic light emitting diode is exposed to the moisture or oxygen, pixel shrinkage phenomenon in which the emission area is reduced is caused or a dark spot is generated in the emission area. The encapsulation layer may be configured by an inorganic film formed of glass, metal, aluminum oxide AlOx, or silicon (Si)-based material or have a structure in which organic films and inorganic films are alternately laminated. The inorganic film serves to block permeation of moisture or oxygen and the organic film serves to planarize a surface of the inorganic film. The reason that the encapsulation layer is formed of a plurality of thin film layers is to make a moving path of the moisture or oxygen longer and more complex than that of a single layer to make it difficult for moisture/oxygen to permeate the organic light emitting diode.

Specifically, the encapsulation layer 120 may include a first inorganic insulating layer 121, an organic insulating layer 122, and a second inorganic insulating layer 123 and the first inorganic insulating layer 121, the organic insulating layer 122, and the second inorganic insulating layer 123 may be sequentially disposed.

A barrier film 140 is located on the encapsulation layer 120 to encapsulate the entire substrate 101 including the organic light emitting diode. The barrier film 140 may be a retardation film or an optically isotropic film. When the barrier film has an optical isotropy, light incident onto the barrier film may be transmitted as it is without delaying a phase. Further, an organic film or an inorganic film may be further located on an upper surface or lower surface of the barrier film. The organic film or the inorganic film which is formed on an upper surface or a lower surface of the barrier film may block permeation of the moisture or oxygen from the outside.

An adhesive layer 145 may be located between the barrier film 140 and the encapsulation layer 120. The adhesive layer 145 adheres the encapsulation layer 120 and the barrier film 140 to each other. The adhesive layer 145 may be a thermosetting adhesive or a natural curing adhesive. For example, the adhesive layer 145 may be configured by a material such as a barrier pressure sensitive adhesive (B-PSA). A touch panel (film), a polarization film, an upper cover, and the like may be further located on the barrier film 140.

Figure 3:
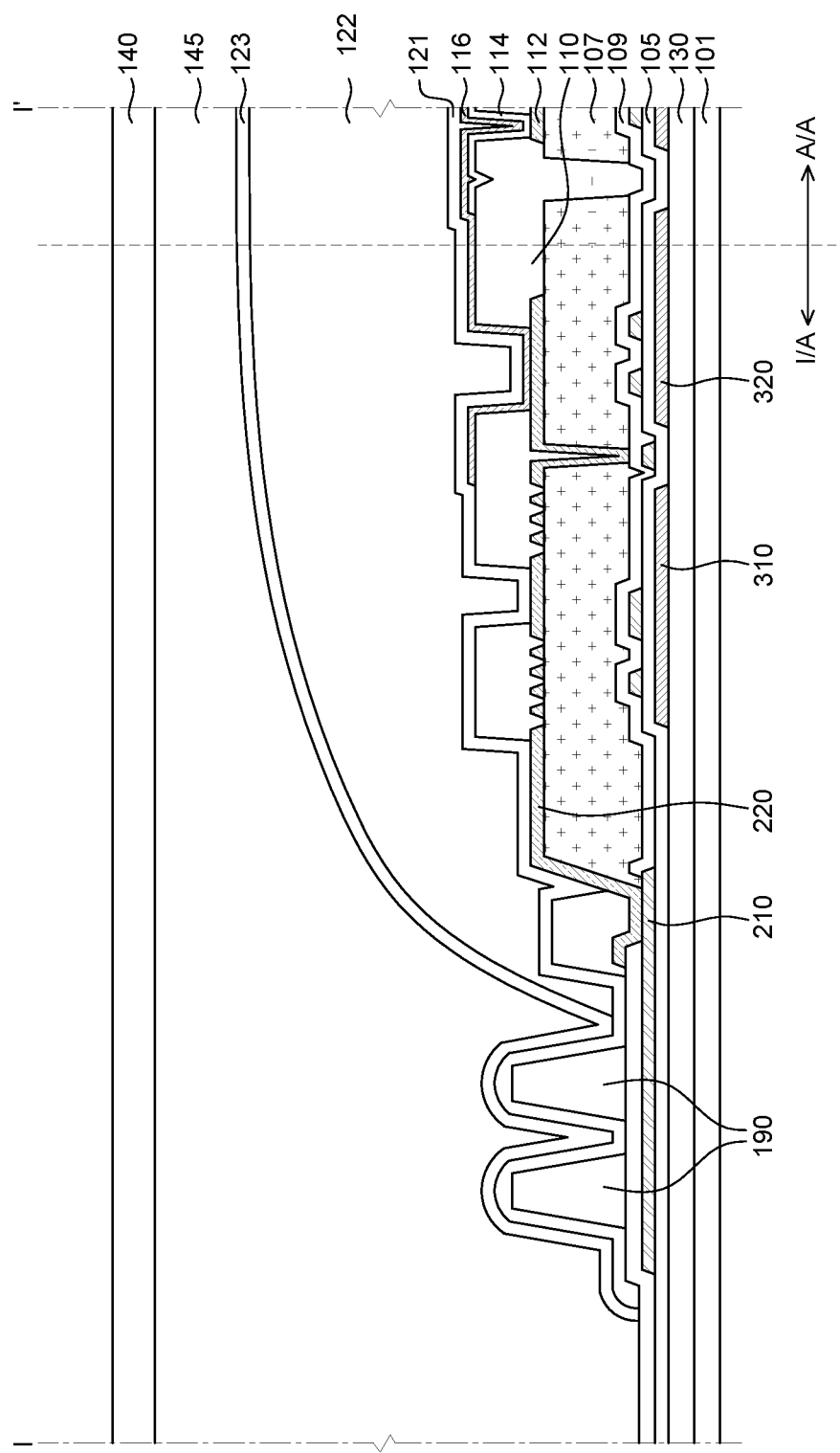
FIG. 3 is a cross-sectional view of an inactive area taken along the line I-I' of FIG. 1 according to the exemplary embodiment of the present disclosure.

FIG. 3 is a cross-sectional view illustrating a cross-section of a cut portion taken along the I-I' which is a part of the inactive area of the display apparatus according to one embodiment. The inactive area I/A may be located at an outer periphery of the active area A/A as illustrated in the drawing and a circuit unit (for example, GIP) or a power line may be disposed thereon. The circuit unit may be disposed between an end of the substrate 101 and the active area A/A and include an emission signal driver 310 and a scan signal driver 320. A reference power voltage line 210 is disposed between the circuit unit and the end of the substrate 101 and a dam 190 may be disposed above (e.g., on) the reference power voltage line 210. The reference power voltage line 210 is connected to the cathode electrode 116 of the active area A/A to supply reference power to drive the organic light emitting diode. The dam 190 may suppress the overflowing of the organic insulating layer 122 of the encapsulation layer 120 to an outer periphery of the substrate 101. The reference power voltage line 210 may be electrically connected to the connection electrode 220 disposed on the circuit unit. In order to connect the connection electrode to the reference power voltage line 210, the planarization layer 107 which covers the circuit unit may be removed. The connection electrode 220 extends to be in contact with the reference power voltage line 210 exposed by removing the planarization layer 107. The connection electrode 220 connected to the reference power voltage line 210 extends to the active area A/A to be disposed on the circuit unit and may be electrically connected to the cathode electrode 116 by means of a space in which a part of the bank 110 which covers the connection electrode 220 is removed.

The first inorganic insulating layer 121, the organic insulating layer 122, and the second inorganic insulating layer 123 which are the encapsulation layer 120 are located above the cathode electrode 116 to cover not only the active area A/A, but also the vicinity of the dam 190 of the inactive area I/A. Further, the first inorganic insulating layer 121, the organic insulating layer 122, and the second inorganic insulating layer 123 may also cover a place adjacent to the end of the substrate 101 by passing the dam 190. However, the dam 190 is a structure for suppressing the overflow of the organic insulating layer 122, so that the organic insulating layer 122 may be disposed so as not to pass the dam 190 as much as possible.

Figure 4A:
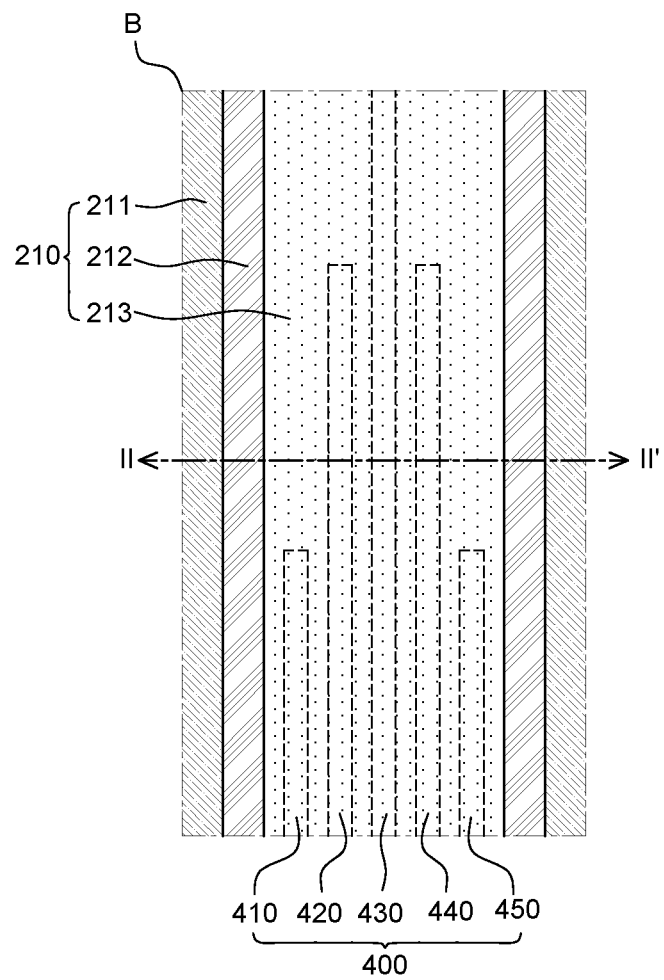
FIGS. 4A and 4B are plan views enlarging a reference power voltage line in a region B of FIG. 1 according to the exemplary embodiment of the present disclosure.
Figure 4B:
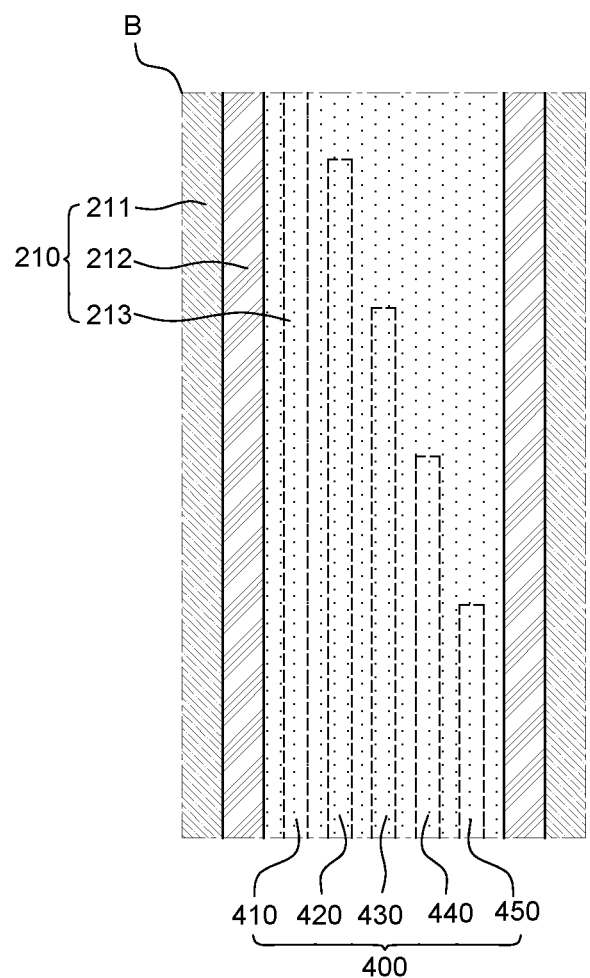

FIG. 4A and FIG. 4B are plan views obtained by enlarging a region B of FIG. 1 as an example of the reference power voltage line 210 according to one embodiment. Referring to FIGS. 4A and 4B, an upper portion is an area adjacent to the connection interface (a pad/bump or a pin) and a lower portion is close to a lower surface of the display apparatus 100 which is far from the connection interface (a pad/bump or a pin). In the exemplary embodiment, it is illustrated that the reference power voltage line 210 has a triple metal structure.

The reference power voltage line 210 may include a first reference voltage line 211, a second reference voltage line 212, and a third reference voltage line 213.

The first reference voltage line 211 may be formed of a separate conductive material and the second reference voltage line 212 may be formed by the same material and the same process as the gate electrode 104 of the thin film transistor. The third reference voltage line 213 may be formed by the same material and the same process as the source and drain electrodes 106 and 108 of the thin film transistor. The reference power voltage line 210 is disposed with a triple metal structure and may be configured such that insulating layers are disposed between the electrodes to electrically connect the electrodes by means of the contact hole of the insulating layer. A detailed structure will be described with reference to the cross-sectional view of FIG. 5.

The structure of the insulating layer will be briefly described. The multi buffer 131 is disposed on the substrate 101 and the active buffer 132, the gate insulating layer 103, and the interlayer insulating layer 105 are disposed in the middle of the reference power voltage lines 210 and below the reference power voltage line 210. Among the reference power voltage lines 210, the third reference power voltage line 213 may be directly electrically connected to the power source or the connection interface (a pad/bump or a pin). The first reference voltage line 211 and the second reference voltage line 212 are formed to overlap the third reference voltage line 213, but may be disposed in a floating state so as not to receive a separate electric signal. However, the electrical connection method of the first to third reference voltage lines 211, 212, and 213 with the power source is not limited thereto and for example, the second reference voltage line 212 may be directly connected to the power source or the first reference voltage line 211 may be directly connected to the power source.

The reference power voltage line 210 is disposed with a triple metal structure in which a width of the first reference voltage line 211 which is the lowest layer is the largest and the width is gradually reduced so that the width of the third reference voltage line 213 is the smallest and the width of the second reference voltage line 212 is less than the width of the first reference voltage line 211 but greater than the width of the third reference voltage line 213. The reason that the voltage lines have different widths is that the first reference voltage line 211 which is the lowest layer is formed of a separate conductive material on a lower layer which is lower than a circuit unit forming layer so that the width thereof is relatively large. The larger the width, the lower the electric resistance. In contrast, the second reference voltage line 212 and the third reference voltage line 213 share the conductive material which configures the circuit unit so that the widths those of may be relatively small to avoid the interference with the circuit unit.

The thickness of the reference power voltage line 210 is increased by applying such a triple structure. Further, the larger the thickness of the wiring line, the larger the cross-section of the wiring line, so that the electric resistance may be reduced inverse-proportionally. Even though the resistance of the reference power voltage line 210 is reduced, the phenomenon in which the resistance of the wiring line is increased as it is spaced apart from the power source or the connection interface (a pad/bump or a pin) does not change. In order to remove the luminance irregularity based on the lowered resistance, the overall resistance of the reference power voltage line 210 may be made constant.

As described with reference to FIG. 1, as the reference power voltage line 210 is farther from the power source or the connection interface (a pad/bump or a pin), the voltage may vary at every point due to the resistance of the wiring line. Therefore, the VSS rising phenomenon occurs, which results in the irregular screen luminance of the display apparatus 100. In order to reduce this phenomenon, according to the exemplary embodiment of FIGS. 4A and 4B, a vertical trench 400 may be disposed so as to overlap the third reference voltage line 213.

The vertical trench 400 has a structure extending along a length direction of the reference power voltage line 210. Referring to FIG. 4A, the vertical trench 400 may include a first vertical trench 410, a second vertical trench 420, a third vertical trench 430, a fourth vertical trench 440, and a fifth vertical trench 450. The trenches may serve as a contact hole which removes the insulating layer between the first reference voltage line 211, the second reference voltage line 212, and the third reference voltage line 213 to be electrically connected.

A power voltage is applied from a starting point of the reference power voltage line 210 through the third reference voltage line 213. Further, the third vertical trench 430 is disposed so that the first reference voltage line 211, the second reference voltage line 212, and the third reference voltage line 213 are in contact with each other.

The second vertical trench 420 and the fourth vertical trench 440 are disposed with a predetermined distance therebetween so that a connection point is widened. When the second vertical trench 420 and the fourth vertical trench 440 are further spaced apart from each other with a larger distance, the first vertical trench 410 and the fifth vertical trench 450 are further formed to have more connection points. Therefore, the resistance increased due to the distance may be cancelled with the increased cross-section. That is, the triple conductive structure is formed by the vertical trench 400 so that the resistance increased in accordance with the distance may be cancelled by increasing the cross-section.

FIG. 4B illustrates a plan view of another exemplary embodiment in which a vertical trench 400 is disposed as in FIG. 4A according to one embodiment. The vertical trench 400 is disposed in consideration of the active area A/A and the power source and the connection interface (a pad/bump or a pin) while maintaining the resistance of the reference power voltage line 210 regardless of the distance of the power source and the connection interface (a pad/bump or a pin). For example, in the area which is close to the power source or the connection interface (a pad/bump or a pin) and is adjacent to the active area A/A, the trench is not disposed, but the vertical trench may be disposed to be far from the active area A/A. A vertical trench 400 may be additionally disposed along the reference power voltage line 210 to be close to the active area A/A in the vicinity of the trench which has been disposed in advance with a predetermined distance from the power source or the connection interface (a pad/bump or a pin). Specifically, the first vertical trench 410, the second vertical trench 420, the third vertical trench 430, the fourth vertical trench 440, and the fifth vertical trench 450 may be disposed in the order closer to the active area A/A from the outermost periphery of the reference power voltage line 210.

In the placement of FIG. 4B, the vertical trench is first disposed at the outer periphery of the reference power voltage line 210 which has a relatively higher resistance due to the distance from the power source or the connection interface (a pad/bump or a pin) and a distance from the active area A/A to lower the resistance.

Figure 5:
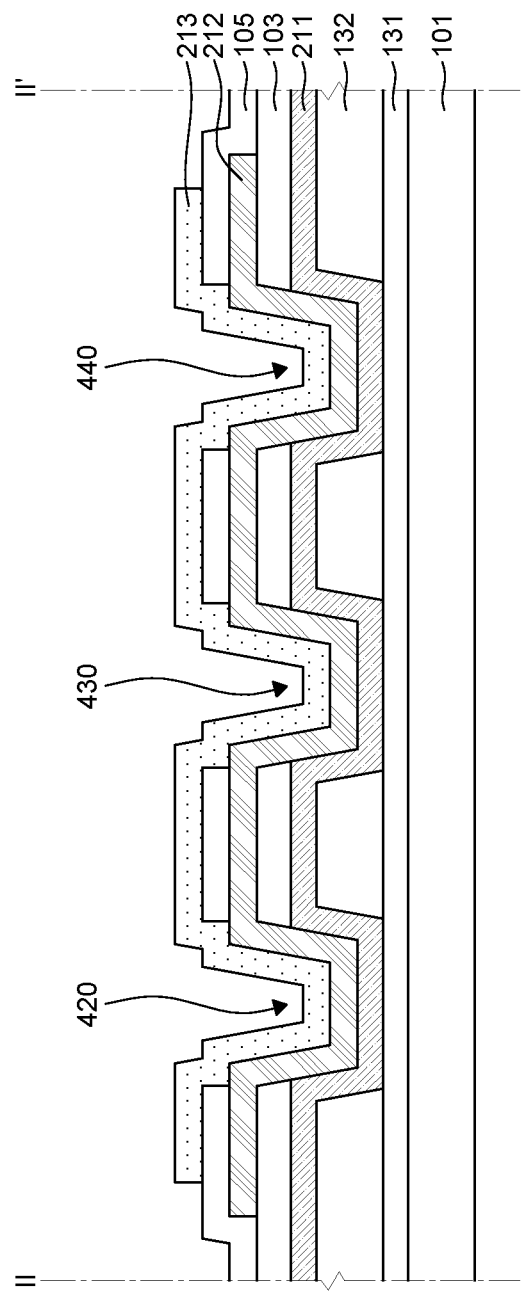
FIG. 5 is a cross-sectional view of a reference power voltage line taken along the line II-II' of FIG. 4A according to the exemplary embodiment of the present disclosure.

FIG. 5 is a cross-sectional view illustrating a cross-section of II-II' of the reference power voltage line illustrated in FIG. 4A according to one embodiment. Referring to FIG. 5, in the cross-section of II-II' of the reference power voltage line 210 disposed in the inactive area I/A, the multi buffer 131 may be disposed on the substrate 101 and the active buffer 132 may be disposed on the multi buffer 131. In the active buffer 132, grooves corresponding to the second vertical trench 420, the third vertical trench 430, and the fourth vertical trench 440 may be formed. The first reference voltage line 211 is disposed on the active buffer 132 to be formed on a lower surface and a side surface of the groove formed in the active buffer 132 without being disconnected.

The gate insulating layer 103 may be disposed on the first reference voltage line 211 and grooves corresponding to the second vertical trench 420, the third vertical trench 430, and the fourth vertical trench 440 are formed, similarly to the active buffer 132, to expose a top surface of the first reference voltage line 211. The second reference voltage line 212 is disposed on the gate insulating layer 103 and is in contact with the first reference voltage line 211 exposed by a groove formed in the gate insulating layer 103. The second reference voltage line 212 may be disposed to have a smaller width than that of the first reference voltage line 211. The interlayer insulating layer 105 may be disposed on the second reference voltage line 212. Grooves corresponding to the second vertical trench 420, the third vertical trench 430, and the fourth vertical trench 440 are formed in the interlayer insulating layer 105, similarly to the active buffer 132 or the gate insulating layer 103, to expose a top surface of the second reference voltage line 212. The third reference voltage line 213 is disposed on the interlayer insulating layer 105 and is in contact with the second reference voltage line 212 exposed by the groove formed in the interlayer insulating layer 105. The third reference voltage line 213 may have a smaller width than those of the first reference voltage line 211 and the second reference voltage line 212. The first reference voltage line 211, the second reference voltage line 212, and the third reference voltage line 213 are electrically connected at the second vertical trench 420, the third vertical trench 430, and the fourth vertical trench 440.

Figure 6:
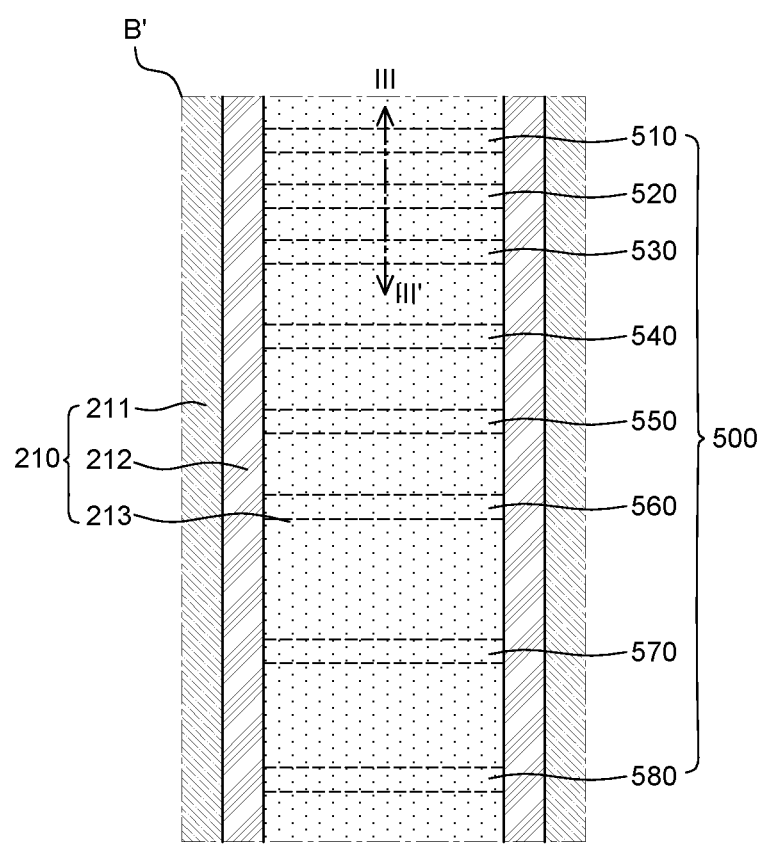
FIG. 6 is a plan view enlarging another exemplary embodiment of a reference power voltage line in a region B' of FIG. 1 according to the exemplary embodiment of the present disclosure.

FIG. 6 is a plan view obtained by enlarging a region B of FIG. 1 as another exemplary embodiment of the reference power voltage line 210. Referring to FIG. 6, an upper portion is an area adjacent to the connection interface (a pad/bump or a pin) and a lower portion is close to a lower surface of the display apparatus 100 which is far from the connection interface (a pad/bump or a pin). In the exemplary embodiment, it is illustrated that the reference power voltage line 210 has a triple metal structure.

The reference power voltage line 210 may include a first reference power voltage line 211, a second reference power voltage line 212, and a third reference power voltage line 213.

The first reference voltage line 211 may be formed of a separate conductive material and the second reference voltage line 212 may be formed by the same material and the same process as the gate electrode 104 of the thin film transistor. The third reference voltage line 213 may be formed by the same material and the same process as the source and drain electrodes 106 and 108 of the thin film transistor. The reference power voltage line 210 is disposed with a triple metal structure and may be configured such that insulating layers are disposed between the electrodes to form electrical connection between the electrodes by means of the contact hole of the insulating layer.

The structure of the insulating layer will be briefly described. The multi buffer 131 is disposed on the substrate 101 and the active buffer 132, the gate insulating layer 103, and the interlayer insulating layer 105 are disposed in the middle of the reference power voltage line 210 and below the reference power voltage line 210. Among the reference power voltage lines 210, the third reference voltage line 213 is directly electrically connected to the power source or the connection interface (a pad/bump or a pin). The first reference voltage line 211 and the second reference voltage line 212 are formed to overlap the third reference voltage line 213, but may be disposed in a floating state so as not to receive a separate electric signal. However, the electrical connection method of the first to third reference voltage lines 211, 212, and 213 with the power source is not limited thereto and for example, the second reference voltage line 212 may be directly connected to the power source or the first reference voltage line 211 may be directly connected to the power source.

The reference power voltage line 210 is disposed with a triple metal structure in which a width of the first reference voltage line 211 which is the lowest layer is the largest and the width is gradually reduced so that the width of the third reference voltage line 213 is the smallest. The reason that the voltage lines have different widths is that the first reference voltage line 211 which is the lowest layer is formed of a separate conductive material on a lower layer which is lower than a circuit unit forming layer so that the width thereof is relatively large. The larger the width, the lower the electric resistance. In contrast, the second reference voltage line 212 and the third reference voltage line 213 share the conductive material which configures the circuit unit so that the width thereof may be small to avoid the interference with the circuit unit.

The thickness of the reference power voltage line 210 is increased by applying such a triple structure. Further, the larger the thickness of the wiring line, the larger the cross-section of the wiring line, so that the electric resistance may be reduced inverse-proportionally. Even though the resistance of the reference power voltage line 210 is reduced, the phenomenon in which the resistance of the wiring line is increased as it is spaced apart from the power source or the connection interface (a pad/bump or a pin) does not change. In order to remove the luminance irregularity based on the lowered resistance, the overall resistance of the reference power voltage line 210 may be made constant.

As described with reference to FIG. 1, as the reference power voltage line 210 is farther from the power source or the connection interface (a pad/bump or a pin), the voltage may vary at every point due to the resistance of the wiring line. Therefore, the VSS rising phenomenon occurs, which results in the irregular screen luminance of the display apparatus 100. In order to reduce this phenomenon, according to the exemplary embodiment of FIG. 6, a horizontal trench 500 may be disposed so as to overlap the third reference voltage line 213.

The horizontal trench 500 may have a structure extending along a horizontal direction of the reference power voltage line 210. The horizontal direction is perpendicular to the vertical direction and traverses the cross-section of the reference power voltage line 210. Referring to FIG. 6, the horizontal trench 500 may include a first horizontal trench 510, a second horizontal trench 520, a third horizontal trench 530, a fourth horizontal trench 540, a fifth horizontal trench 550, a sixth horizontal trench 560, a seventh horizontal trench 570, and an eighth horizontal trench 580. According to the present exemplary embodiment, as an example of the horizontal trench 500, the first to eighth horizontal trenches 510, 520, 530, 540, 550, 560, 570, and 580 are provided, but it is not limited thereto and less or more horizontal trenches may be disposed. In the trench, the length of the wiring lines may be locally increased by the unevenness formed in the structure in which holes are disposed by removing an insulating layer between the first reference voltage line 211, the second reference voltage line 212, and the third reference voltage line 213 and the lines are electrically connected.

A power voltage is applied from a starting point of the reference power voltage line 210 through the third reference voltage line 213. Further, the horizontal trench 500 is disposed so that the first reference voltage line 211, the second reference voltage line 212, and the third reference voltage line 213 are locally in contact with each other.

Based on the principle that the electric resistance increases in proportion to the distance, as it is closer to the power source or the connection interface (a pad/bump or a pin), the distance is locally increased by the horizontal trench 500 so that the electric resistance is correspondingly increased. In order to reduce the resistance which is naturally increased as it is far from the power source or the connection interface (a pad/bump or a pin), the placement of the horizontal trench 500 by which the distance of the wiring line is increased may be reduced. Referring to FIG. 6, in the upper portion close to the power source or the connection interface (a pad/bump or a pin), the first to third horizontal trenches 510, 520, and 530 are disposed with a narrow interval. In contrast, in a lower portion which is far from the power source or the connection interface (a pad/bump or a pin), the sixth to eighth horizontal trenches 560, 570, and 580 are disposed with a larger interval than that of the first to third horizontal trenches 510, 520, and 530.

Figure 7:
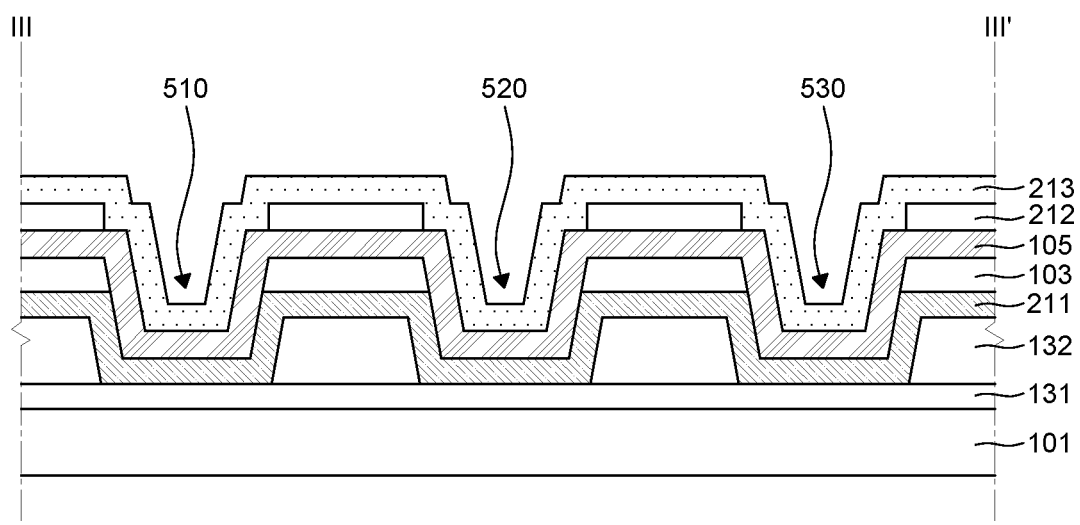
FIG. 7 is a cross-sectional view of a reference power voltage line taken along the line III-III' of FIG. 6 according to the exemplary embodiment of the present disclosure.

FIG. 7 is a cross-sectional view illustrating a cross-section taken along the line III-III' of the reference power voltage line 210 of FIG. 6 according to one embodiment. Referring to FIG. 7, in the cross-section of III-III' the reference power voltage line 210 disposed in the inactive area I/A, the multi buffer 131 is disposed on the substrate 101 and the active buffer 132 is disposed on the multi buffer 131. In the active buffer 132, grooves corresponding to the first horizontal trench 510, the second horizontal trench 520, and the third horizontal trench 530 may be formed. The first reference voltage line 211 may be disposed on the active buffer 132 and formed on a lower surface and a side surface of the groove formed in the active buffer 132 without being disconnected.

The gate insulating layer 103 may be disposed on the first reference voltage line 211 and grooves corresponding to the first horizontal trench 510, the second horizontal trench 520, and the third horizontal trench 530 are formed, similarly to the active buffer 132, to expose a top surface of the first reference voltage line 211. The second reference voltage line 212 may be disposed on the gate insulating layer 103 and may be in contact with the first reference voltage line 211 exposed by a groove formed in the gate insulating layer 103. The interlayer insulating layer 105 may be disposed on the second reference voltage line 212. Grooves corresponding to the first horizontal trench 510, the second horizontal trench 520, and the third horizontal trench 530 are formed in the interlayer insulating layer 105, similarly to the active buffer 132 or the gate insulating layer 103, to expose a top surface of the second reference voltage line 212. The third reference voltage line 213 may be disposed on the interlayer insulating layer 105 and may be in contact with the second reference voltage line 212 exposed through the groove formed in the interlayer insulating layer 105. The first reference voltage line 211, the second reference voltage line 212, and the third reference voltage line 213 are electrically connected at the first horizontal trench 510, the second horizontal trench 520, and the third horizontal trench 530.

As described above, the horizontal trench 500 is disposed so that unevenness is formed between the trenches and the first reference voltage line 211, the second reference voltage line 212, and the third reference voltage line 213 are disposed in the unevenness so that the length of the wiring line is increased. Further, when the lengths of the first reference voltage line 211, the second reference voltage line 212, and the third reference voltage line 213 are increased, the resistance is locally increased.

The display apparatus according to the exemplary embodiments of the present disclosure may include a liquid crystal display apparatus LCD, a field emission display apparatus FED, an organic light emitting display apparatus OLED and a quantum dot display apparatus.

The display apparatus according to the exemplary embodiments of the present disclosure may also include equipment display apparatus including complete product or final product of LCM, OLED or QD module, for example, notebook computer, television, computer monitor, automotive display apparatus, or other vehicle display apparatuses, and set electronic devices or set device (set apparatus) such as mobile electronic devices of smart phone or electronic pad.

The exemplary embodiments of the present disclosure can also be described as follows:

According to an aspect of the present disclosure, there is provided a display apparatus. The display apparatus includes a substrate including an active area and an inactive area. The display apparatus further includes a transistor, an anode electrode, an organic light emitting layer, and a cathode electrode disposed in the active area. The display apparatus further includes a circuit unit, a dam, and a reference power voltage line disposed in the inactive area. The reference power voltage line includes first to third conductive layers and the first to third conductive layers are formed to overlap.

The first to third conductive layers may be formed to have different widths.

The reference power voltage line may be disposed on first and second insulating layers, a third insulating layer may be disposed between the first conductive layer and the second conductive layer, a fourth insulating layer is disposed between the second conductive layer and the third conductive layer, and the third insulating layer and the fourth insulating layer are disposed to overlap each other.

At least one trench through which the first to third conductive layers are in contact with each other may be disposed by forming holes overlapping in the same position of the second to fourth insulating layers.

At least one trench through which the second conductive layer is in contact with the first and third conductive layers may be disposed by forming holes overlapping in the same position of the second to fourth insulating layers.

The at least one trench may be a plurality of trenches and an unevenness may be formed between the plurality of trenches.

The at least one trench may be a vertical trench which is parallel to a length direction of the reference power voltage line.

The at least one trench may be a horizontal trench which is parallel to a width direction of the reference power voltage line.

The at least one vertical trench may be configured by a plurality of trenches and some of the plurality of vertical trenches may have different lengths.

The at least one horizontal trench may be configured by a plurality of horizontal trenches, the plurality of horizontal trenches may have the same length, and at least one of placement distances between the plurality of horizontal trenches may be different from the other placement distances.

According to another aspect of the present disclosure, there is provided a display apparatus. The display apparatus includes a substrate including an active area and an inactive area. The display apparatus includes a transistor, an anode electrode, an organic light emitting layer, and a cathode electrode disposed in the active area. The display apparatus includes a reference power voltage line disposed in the inactive area. The reference power voltage line includes first to third conductive layers and the first to third conductive layers have different widths.

The inactive area may further include a dam and a circuit unit.

The first to third conductive layers may be formed to have different widths.

The first conductive layer may at least partially overlap the circuit unit.

The reference power voltage line may be disposed on first and second insulating layers and third and fourth insulating layers may be disposed between the first to third conductive layers to overlap.

A plurality of trenches through which the first to third conductive layers are in contact with each other may be disposed by forming holes overlapping in the same position of the second to fourth insulating layers.

A plurality of trenches through which the second conductive layer is in contact with the first and third conductive layers may be disposed by forming holes overlapping in the same position of the second to fourth insulating layers.

The plurality of trenches may be vertical trenches which are parallel to a length direction of the reference power voltage line.

The plurality of trenches may be horizontal trenches which are parallel to a width direction of the reference power voltage line.

At least one of the plurality of vertical trenches may have a different length.

The plurality of horizontal trenches may have the same length, and at least one of placement distances between the plurality of horizontal trenches may be different from the other placement distances.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
a substrate including an active area and an inactive area;
a transistor and a light emitting diode in the active area, the light emitting diode electrically connected to the transistor; and
a circuit unit in the inactive area;
a dam in the inactive area;
at least one trench including one or more holes in the inactive area; and
a reference power voltage line which is disposed in the inactive area and includes a first conductive layer, a second conductive layer, and a third conductive layer in the inactive area, wherein at least one of the first conductive layer, the second conductive layer, or the third conductive layer horizontally overlaps with a remaining two conductive layers included in the reference power voltage line in a vertical direction,
wherein the second conductive layer is in contact with the first conductive layer and the third conductive layer through the one or more holes,
wherein the at least one trench is a vertical trench that extends in a direction that is parallel to a length direction of the reference power voltage line,
wherein the at least one vertical trench comprises a plurality of trenches, and at least two of the plurality of vertical trenches have different lengths in the direction that is parallel to the length direction of the reference power voltage line.

2. The display apparatus according to claim 1, wherein the first conductive layer, the second conductive layer, and the third conductive layer have different horizontal widths in a plan view of the display apparatus.

3. The display apparatus according to claim 1, wherein the first conductive layer is on a first insulating layer and a second insulating layer, a third insulating layer is between a portion of the first conductive layer and the second conductive layer, a fourth insulating layer is disposed between a portion of the second conductive layer and the third conductive layer, wherein the third insulating layer and the fourth insulating layer overlap each other in the vertical direction.

4. The display apparatus according to claim 3, wherein the one or more holes go through the second insulating layer, the third insulating layer, and the fourth insulating layer.

5. The display apparatus according to claim 1, wherein the first conductive layer at least partially overlaps the circuit unit.

6. A display apparatus, comprising:
a substrate including an active area and an inactive area;
a transistor and a light emitting diode in the active area, the light emitting diode electrically connected to the transistor;

a plurality of trenches including a plurality of holes in an inactive area; and a reference power voltage line which is disposed in the inactive area and includes a first conductive layer, a second conductive layer, and a third conductive layer, wherein horizontal widths of the first conductive layer, the second conductive layer, and the third conductive layer are different in a plan view of the display apparatus, wherein the second conductive layer is in contact with the first conductive layer and the third conductive layer through the plurality of holes, wherein the plurality of trenches are vertical trenches that extend in a direction that is parallel to a length direction of the reference power voltage line, wherein at least two of the plurality of vertical trenches have different lengths in the direction that is parallel to the length direction of the reference power voltage line.

7. The display apparatus according to claim 6, wherein the inactive area further includes a dam and a circuit unit.

8. The display apparatus according to claim 7, wherein the first conductive layer at least partially overlaps the circuit unit.

9. The display apparatus according to claim 6, wherein the first conductive layer is on a first insulating layer and a second insulating layer, and a third insulating layer and a fourth insulating layer overlap each other and are disposed between the first conductive layer to the third conductive layer.

10. The display apparatus according to claim 9, wherein the plurality of holes go through the second insulating layer, the third insulating layer, and the fourth insulating layer.

11. A display apparatus, comprising:

a substrate including an active area and an inactive area;

a plurality of organic light emitting diodes disposed in the active area;

a plurality of trenches disposed in the inactive area; and a reference power voltage line in the inactive area, the reference power voltage line configured to supply reference power to drive the plurality of organic light emitting diodes;

wherein the reference power voltage line includes a first conductive layer, a second conductive layer, and a third conductive layer that horizontally overlap each other in a vertical direction;

wherein the second conductive layer is in direct contact with the first conductive layer and the third conductive layer through the plurality of trenches, wherein the plurality of trenches are vertical trenches that extend in a direction that is parallel to a length direction of the reference power voltage line, wherein at least two of the plurality of vertical trenches have different lengths in the direction that is parallel to the length direction of the reference power voltage line.

* * * * *